United States Patent [19]

Richardson

[11] Patent Number: 4,872,173
[45] Date of Patent: Oct. 3, 1989

[54] METHOD AND APPARATUS FOR STABILIZING THE SPECTRAL CHARACTERISTICS OF A SEMICONDUCTOR LASER DIODE

[75] Inventor: Bruce A. Richardson, Nepean, Canada

[73] Assignee: Northern Telecom Limited, Montreal, Canada

[21] Appl. No.: 239,880

[22] Filed: Sep. 2, 1988

[51] Int. Cl.⁴ .............................................. H01S 3/13
[52] U.S. Cl. ...................................... 372/29; 372/33; 372/38
[58] Field of Search ............................. 372/9, 29–32, 372/33, 38, 43, 97

[56] References Cited

U.S. PATENT DOCUMENTS

| | | | |
|---|---|---|---|
| 3,466,565 | 9/1969 | Rigrod | 331/94.5 |
| 3,524,147 | 8/1970 | Soffer et al. | 332/7.51 |
| 3,899,748 | 8/1975 | Bodlaj | 331/94.5 |
| 3,965,440 | 6/1976 | Graves | 331/94.5 |
| 4,019,159 | 4/1977 | Hon et al. | 332/7.51 |
| 4,237,427 | 12/1980 | Holland | 372/38 |
| 4,450,565 | 5/1984 | Copeland | 372/38 |
| 4,680,769 | 7/1987 | Miller | 372/50 |
| 4,683,573 | 7/1987 | Albanese | 372/34 |
| 4,720,163 | 1/1988 | Goodwin et al. | 350/96.20 |
| 4,819,240 | 4/1989 | Takiguchi et al. | 372/29 |

OTHER PUBLICATIONS

Acket et al., IEEE J. Quantum Electron., 1984, QE-20, pp. 1163–1169.
Tkach et al., IEEE J. Lightwave Technology, 1986, LT-4, pp. 1655–1661.
Favre et al., "Autostability Technique for Achieving Highly Stable Resonant Optical Feedback in a Fibre Resonator" Electron. Lett., 1983, vol. 19, pp. 1046–1048.
Ho et al., "Optical Feedback Phase-Autolocking of a Semiconductor Laser", Third International Conference on Optical Fiber Sensors, San Diego, 13–14, Feb. 1985.
Neilsen et al., J. Opt. Commun., 1984, p. 41, "Linewidth Stabilization of Semiconductor Lasers in an External Cavity".
Jain et al., Electron. Lett., vol. 21, pp. 957–958; "Stabilization of External Optical Feedback Phase in a Semiconductor Laser."

Primary Examiner—William L. Sikes
Assistant Examiner—B. R. R. Holloway
Attorney, Agent, or Firm—C. W. Junkin

[57] ABSTRACT

In a method and apparatus for stabilizing the emission spectrum of a semiconductor laser diode, an external optical cavity is coupled to the laser diode to couple light from an active region of the laser diode to the external cavity and from the external cavity to the active region of the laser diode. The phase of light coupled from the external cavity to the active region of the laser diode is dithered about a phase operating point at a dither frequency. A component of the forward voltage across the laser at the dither frequency is sensed and a feedback signal indicative of the amplitude of said component of the forward voltage and the phase of said component of the forward voltage relative to the phase of the dither is generated. The phase operating point is changed in response to the feedback signal to minimize the amplitude of said component of the forward voltage. The method and apparatus are useful for stabilization of laser diodes used in high performance optical communications systems.

20 Claims, 3 Drawing Sheets

METHOD AND APPARATUS FOR STABILIZING THE SPECTRAL CHARACTERISTICS OF A SEMICONDUCTOR LASER DIODE

FIELD OF THE INVENTION

The present invention relates to methods and apparatus for stabilizing the spectral characteristics of a semiconductor laser diode.

BACKGROUND OF THE INVENTION

Semiconductor laser diodes having stable emission spectra are desirable for use in high performance optical communications systems.

External optical cavities have been optically coupled to semiconductor laser diodes to modify the emission spectra of the semiconductor laser diodes (Goldberg et al, IEEE J. Quantum Electron., 1982, QE-18, pp. 555–563; Acket et al, IEEE J. Quantum Electron., 1984, QE-20, pp. 1163–1169, Tkach et al, IEEE J. Lightwave Technology, 1986, LT-4, pp. 1655–1661). The modified spectra are sensitive to the phase of external optical feedback from the external optical cavity. Hence, the phase of the external optical feedback must be controlled in order to stabilize the modified spectra.

Several schemes for controlling the phase of the external optical feedback have been discussed in the literature (Favre et al, Electron. Lett., 1983, Vol. 19, pp. 1046–1048; Ho et al, Third International Conference on Optical Fiber Sensors, San Diego, 13–14 February 1985; Neilsen et al, J. Opt. Commun., 1984, pp. 41; Jain et al, Electron. Lett., Vol. 21. pp. 957–958). Each of these schemes requires one or more photodetectors which add to the cost and complexity of optical transmitters employing such schemes.

SUMMARY OF THE INVENTION

The present invention provides a novel method and apparatus for stabilizing the emission spectrum of a semiconductor diode laser which avoid the requirement for photodetectors.

One aspect of the present invention provides a method for stabilizing the emission spectrum of a semiconductor laser diode, the method comprising:

optically coupling an external optical cavity to the laser diode to couple light from an active region of the laser diode to the external cavity and from the external cavity to the active region of the laser diode;

dithering the phase of light coupled from the external cavity to the active region of the laser diode about a phase operating point at a dither frequency;

sensing a component of the forward voltage across the laser at the dither frequency;

generating a feedback signal indicative of the amplitude of said component of the forward voltage and the phase of said component of the forward voltage relative to the phase of the dither; and changing the phase operating point in response to the feedback signal to minimize the amplitude of said component of the forward voltage.

Another aspect of the invention provides apparatus for stabilizing the emission spectrum of a semiconductor laser diode, the apparatus comprising:

an external optical cavity optically coupled to the laser diode to couple light from an active region of the laser diode to the external cavity and from the external cavity to the active region of the laser diode;

phase control means responsive to a phase control signal for controlling the phase of light coupled from the external cavity to the active region of the laser diode;

dither means for dithering the phase control signal to dither the phase of light coupled from the external cavity to the active region of the laser diode about a phase operating point at a dither frequency;

feedback means for sensing a component of the forward voltage across the laser at the dither frequency, generating a feedback signal indicative of the amplitude of said component of the forward voltage and the phase of said component of the forward voltage relative to the phase of the dither, and changing the phase operating point in response to the feedback signal to minimize the amplitude of said component of the forward voltage.

The method and apparatus according to the invention rely on detection of the first derivative of the forward voltage across the laser diode with respect to the phase of the optical feedback to sense the phase of the optical feedback from the external cavity into the active region of the laser diode. Consequently no photodetectors are required in the feedback loop used to stabilize the phase of the optical feedback.

BRIEF DESCRIPTION OF THE DRAWINGS

Embodiments of the invention will now be described by way of example only with reference to the accompanying drawings, in which:

FIG. 1 illustrates apparatus 100 according to a first embodiment for stabilizing the emission spectrum of a semiconductor laser diode 110. The apparatus 100 comprises drive means in the form of a modulated current source 120 for driving the laser diode 110.

Figure 1:
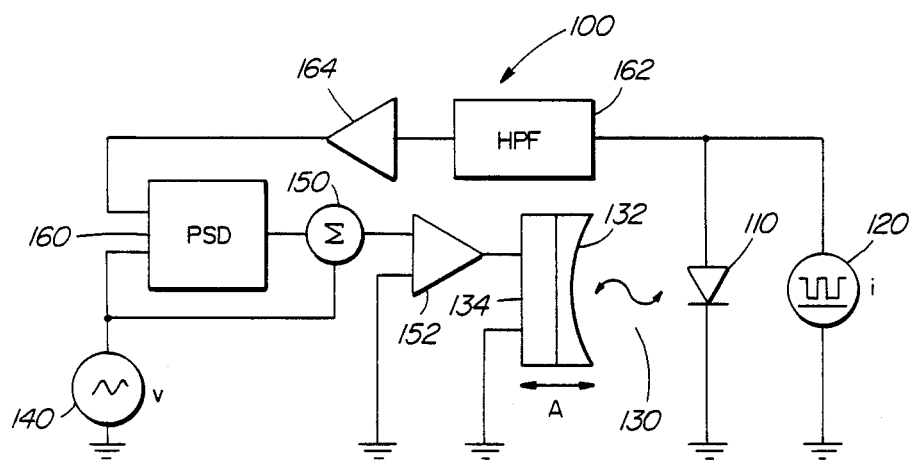
FIG. 1 is a schematic diagram of apparatus according to a first embodiment.

The apparatus 100 further comprises an external optical cavity 130 which is optically coupled to the laser diode 110 to couple light from an active region of the laser diode 110 to the external cavity 130 and from the external cavity 130 to the active region of the laser diode 110.

An axial dimension of the external cavity 130 is defined by a reflecting means in the form of a mirror 132. The mirror 132 is mounted to moving means in the form of a piezoelectric crystal 134 for axial movement toward and away from the laser diode 110 as indicated by the arrow A. Movement of the mirror 132 toward or away from the laser diode 110 changes the phase of light coupled from the external cavity 130 to the active region of the laser diode 110, thereby changing the centre frequency and width of the emission spectrum of the laser diode 110. Thus, the mirror 132 and the piezoelectric crystal 134 together comprise phase control means responsive to a phase control signal applied to the piezoelectric crystal 134 to control the phase of light coupled from the external cavity 130 to the active region of the laser diode 110.

The apparatus 100 further comprises dither means in the form of a dither signal generator 140 which generates a dither signal at a particular dither frequency. The dither frequency is much lower than the frequency of the modulated current source 120. The dither signal drives the piezoelectric crystal 134 through summation means comprising a summer 150 and a drive amplifier 152 to dither the phase of light coupled from the external cavity 130 to the active region of the laser diode 110.

Figure 2:
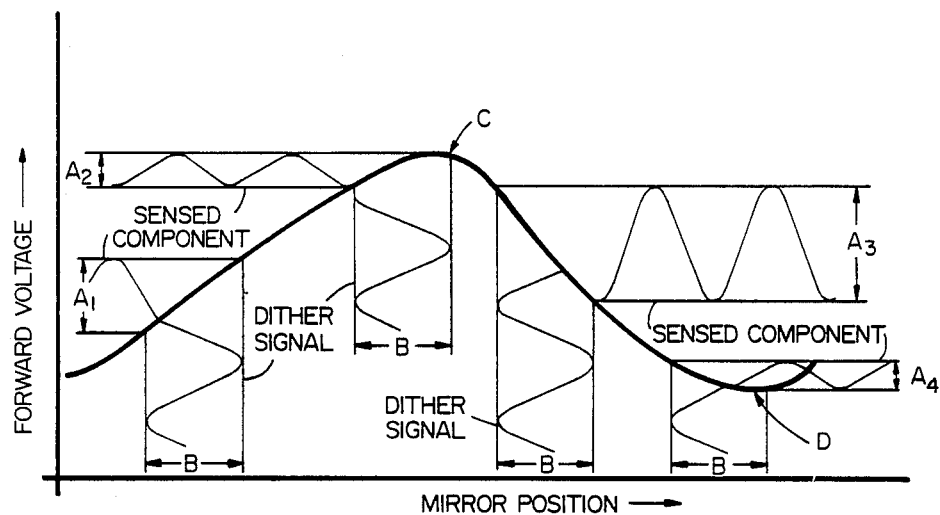
FIG. 2 is a plot of forward voltage across a laser diode of the apparatus of FIG. 1 versus the position of a mirror of the apparatus of FIG. 1.

FIG. 2 is a plot of the forward voltage across the laser diode 110 versus the position of the mirror 132. The position of the mirror 132 determines the phase of optical feedback from the external cavity 130 to the active region of the laser diode 110. The phase of the optical feedback affects the centre frequency of the laser diode 110. Any change in the centre frequency of the laser diode 110 is accompanied by a corresponding change in the forward voltage across the laser diode 110.

The dither signal drives the mirror 132 into periodic motion, causing the phase of light coupled from the external cavity 130 to the active region of the laser diode 110 to dither about a phase operating point. The phase dither causes the forward voltage across the laser diode 110 to vary periodically at the dither frequency. As shown in FIG. 2, the amplitude A of the periodic variation of the forward voltage for a given amplitude B of mirror motion depends on the phase operating point. In particular, the amplitude A of the periodic variation of the forward voltage is minimized when the phase operating point corresponds to a local maximum C or minimum D in the forward voltage characteristic shown in FIG. 2.

Figure 3:
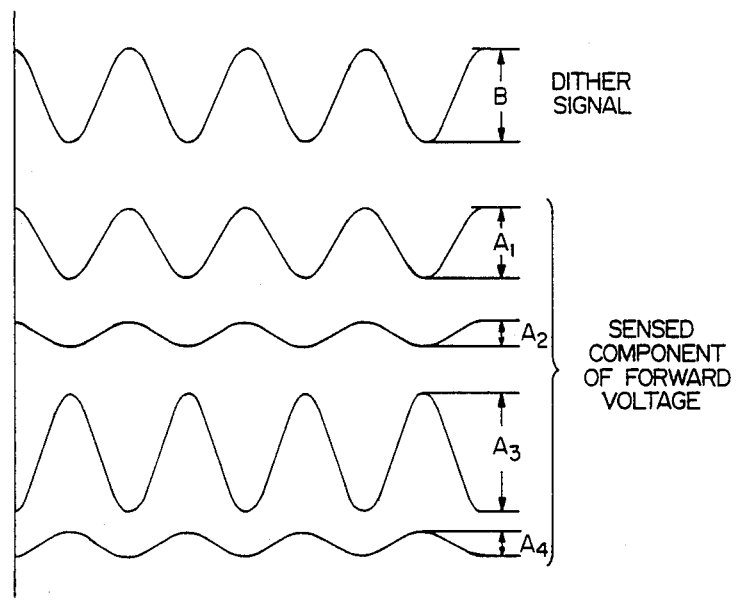
FIG. 3 is a plot of forward voltage versus time for different positions of the mirror.

Moreover, as shown in FIG. 3, the periodic variation of the forward voltage is in phase with the dither signal for phase operating points on one side of a local maximum C or minimum D and out of phase with the dither signal on an opposite sides of the local maximum C or minimum D.

The apparatus 100 further comprises feedback means in the form of a phase sensitive detector 160 which is AC coupled to the laser diode 110 via a high pass filter 162 and a low frequency amplifier 164. The phase sensitive detector 160 is tuned to the dither frequency to sense a component of the forward voltage across the laser diode 110 at the dither frequency. The phase sensitive detector 160 generates a feedback signal having a magnitude corresponding to the amplitude of the component of the forward voltage at the dither frequency and having a polarity corresponding to the phase of that component relative to the phase of the dither signal.

The phase sensitive detector 160 is connected to the summer 150 to add the feedback signal to the dither signal for application to the piezoelectric crystal 134 via the drive amplifier 152. The feedback signal adds a component to the dither signal which shifts the position about which the mirror 132 is dithered toward or away from the laser diode 110. This shift in the mirror dither changes the phase operating point about which the phase of light coupled from the external cavity 130 to the active region of the laser diode 110 is dithered so as to reduce the amplitude of the sensed component of the forward voltage. Continued feedback stabilizes the phase operating point at a point corresponding to a local maximum C or minimum D of the forward voltage characteristic where the amplitude of the sensed component of the forward voltage is minimized, thereby stabilizing the emission spectrum of the laser diode 110. Any small perturbation of the phase operating point away from the local maximum C or minimum D gives rise to a feedback signal which drives the phase operating point back toward the local maximum C or minimum D.

The time constant of the phase sensitive detector 160 is made large enough to ensure stability. For example, a phase sensitive detector 160 having a time constant of three seconds is suitable for a modulation rate of 300 Mbps and a reference signal frequency of 400 Hertz.

In order to keep the periodic variation of the centre frequency and spectral width within acceptable bounds, the dither signal amplitude and the gain of the piezoelectric crystal drive amplifier 152 should be adjusted for very slight oscillatory movement of the mirror 132, for example 0.05 microns of peak to peak displacement.

Figure 4:
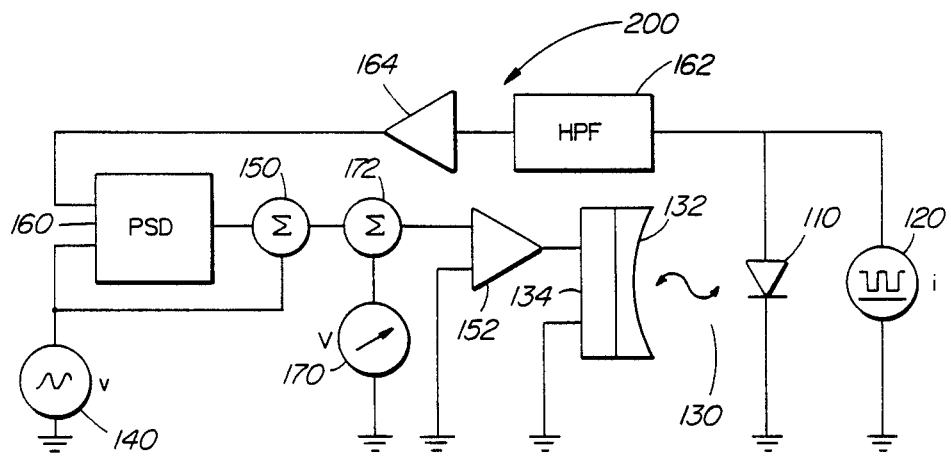
FIG. 4 is a schematic diagram of apparatus according to a second embodiment.

FIG. 4 shows apparatus 200 according to a second embodiment which differs from the apparatus 100 according to the first embodiment in that variable DC offset means in the form of a variable DC voltage source 170 and a summer 172 are connected between the output of the summer 150 and the input of the piezoelectric crystal drive amplifier 152. The DC offset may be varied by means of the variable DC voltage source 170 to select a different peak or trough of the forward voltage versus mirror position characteristic shown in FIG. 2 as the point of stabilization. Alternatively, the DC offset means may be built into the phase sensitive detector 160 or the summer 150.

Figure 5:
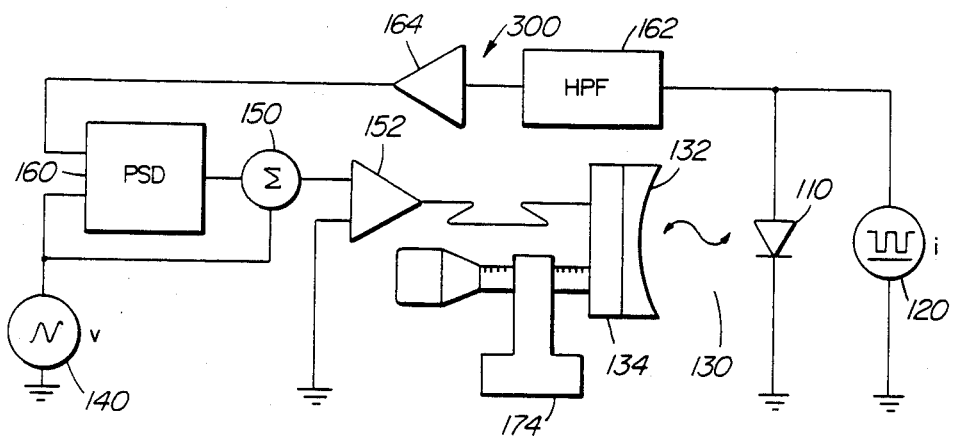
FIG. 5 is a schematic diagram of apparatus according to a third embodiment.

FIG. 5 shows apparatus 300 according to a third embodiment which differs from the apparatus 200 according to the second embodiment in that the means for adjusting the phase operating point in the form of a variable DC voltage source 170 and a summing amplifier 172 are replaced with mechanical mirror position adjustment means in the form of a micrometer 174 to which the piezoelectric crystal 134 is mounted. The mirror position may be varied by means of the micrometer 174 to select a different peak or trough of the forward voltage versus mirror position characteristic shown in FIG. 2 as the point of stabilization. Alternatively, the micrometer 174 may be mechanically connected to the laser diode 110 to adjust the position of the laser diode 110.

Figure 6:
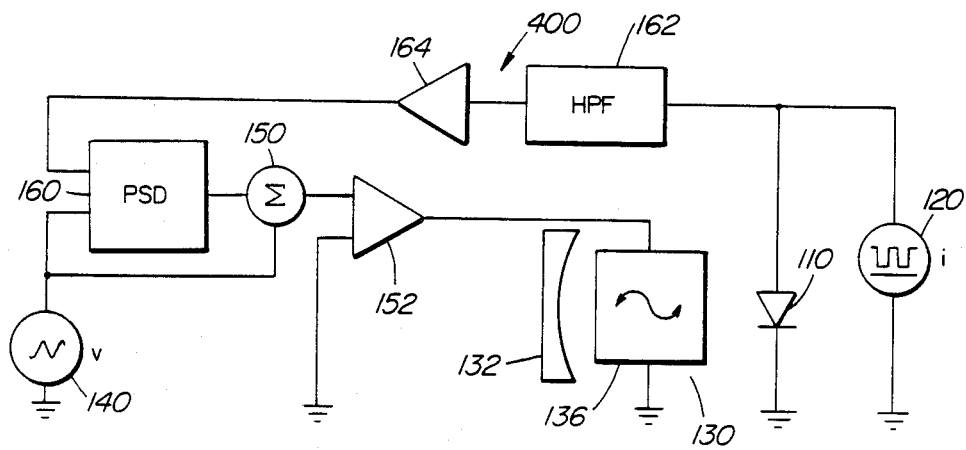
FIG. 6 is a schematic diagram of apparatus according to a fourth embodiment.

FIG. 6 shows apparatus 400 according to a fourth embodiment which differs from the apparatus 100 according to the first embodiment in that the mirror 132 is fixed, and an electro-optic crystal 136 is disposed within the external cavity 130. The output of the amplifier 152 is applied to the electro-optic crystal 136 to vary the refractive index of the crystal 136, thereby varying the effective optical length of the external cavity 130 and hence the phase of optical feedback from the external cavity 130 to the active region of the laser diode 110.

The DC offset means or mechanical mirror position adjustment means of the apparatus 200, 300 according to the second and third embodiments may be added to the apparatus 400 according to the fourth embodiment to provide some selectivity of the point of stabilization.

Figure 7:
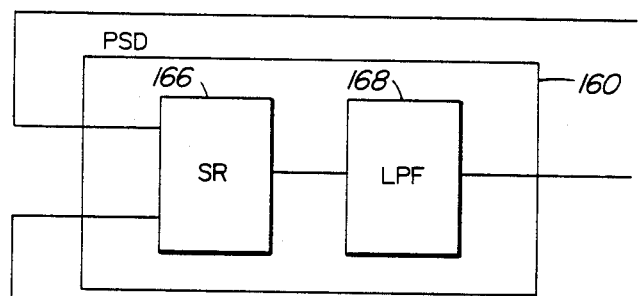
FIG. 7 is a schematic diagram of one implementation of a phase sensitive detector of the apparatus of FIGS. 1, 4, 5 and 6.

The phase sensitive detector 160 of the apparatus 100, 200, 300, 400 according to the first, second, third and fourth embodiments may be implemented as a synchronous rectifier 166 connected in series with a low pass filter 168 as shown in FIG. 7.

The summer 150 or drive amplifier 152 may be provided with capacitive feedback so as to integrate the feedback signal. Integration of the feedback signal should improve system stability for high D.C. loop gains.

The embodiments of the invention in which an exclusive property or privilege is claimed are defined as follows:

1. A method for stabilizing the emission spectrum of a semiconductor laser diode, the method comprising:
   optically coupling an external optical cavity to the laser diode to couple light from an active region of the laser diode to the external cavity and from the external cavity to the active region of the laser diode;
   dithering the phase of light coupled from the external cavity to the active region of the laser diode about a phase operating point at a dither frequency;
   sensing a component of the forward voltage across the laser at the dither frequency;
   generating a feedback signal indicative of the amplitude of said component of the forward voltage and the phase of said component of the forward voltage relative to the phase of the dither; and
   changing the phase operating point in response to the feedback signal to minimize the amplitude of said component of the forward voltage.

2. A method as defined in claim 1, comprising dithering the phase of light coupled from the external cavity to the active region of the laser diode and changing the phase operating point by moving reflecting means defining a dimension of the external cavity to change said dimension of the external cavity.

3. A method as defined in claim 1, comprising dithering the phase of light coupled from the external cavity to the active region of the laser diode and changing the phase operating point by changing the refractive index of at least a portion of the external cavity.

4. A method as defined in claim 1, further comprising adjusting the phase operating point to adjust the spectral characteristics of the laser diode.

5. A method as defined in claim 4, comprising dithering the phase of light coupled from the external cavity to the active region of the laser diode, changing the phase operating point and adjusting the phase operating point by moving reflecting means defining a dimension of the external cavity to change said dimension of the external cavity.

6. A method as defined in claim 4, comprising dithering the phase of light coupled from the external cavity to the active region of the laser diode, changing the phase operating point and adjusting the phase operating point by changing the refractive index of at least a portion of the external cavity.

7. A method as defined in claim 1, further comprising driving the laser diode with a modulated current at a frequency much greater than the dither frequency.

8. Apparatus for stabilizing the emission spectrum of a semiconductor laser diode, the apparatus comprising:
   an external optical cavity optically coupled to the laser diode to couple light from an active region of the laser diode to the external cavity and from the external cavity to the active region of the laser diode;
   phase control means responsive to a phase control signal for controlling the phase of light coupled from the external cavity to the active region of the laser diode;
   dither means for dithering the phase control signal to dither the phase of light coupled from the external cavity to the active region of the laser diode about a phase operating point at a dither frequency;
   feedback means for sensing a component of the forward voltage across the laser at the dither frequency, generating a feedback signal indicative of the amplitude of said component of the forward voltage and the phase of said component of the forward voltage relative to the phase of the dither, and changing the phase operating point in response to the feedback signal to minimize the amplitude of said component of the forward voltage.

9. Apparatus as defined in claim 8, wherein the dither means comprises:
   a dither signal generator for generating a dither signal at the dither frequency; and the feedback means comprises:
   a phase sensitive detector tuned to the dither frequency, said phase sensitive detector being AC coupled to the laser diode to sense said component of the forward voltage across the laser diode; and
   summation means coupled to the dither signal generator and the phase sensitive detector for summing the dither signal and the feedback signal and applying the resulting phase control signal to the phase control means.

10. Apparatus as defined in claim 9, wherein the phase sensitive detector comprises a synchronous rectifier and a low pass filter connected in series.

11. Apparatus as defined in claim 9, wherein the summation means comprises amplification means.

12. Apparatus as defined in claim 9, wherein the summation means integrates the feedback signal for application to the phase control means.

13. Apparatus as defined in claim 8, wherein the phase control means comprises movably mounted reflecting means defining a dimension of the external cavity and moving means for moving the reflecting means to control said dimension of the external cavity.

14. Apparatus as defined in claim 13, wherein the moving means comprises a piezoelectric crystal and the reflecting means comprises a reflecting surface carried on the crystal.

15. Apparatus as defined in claim 8, wherein the phase control means comprises refractive index changing means for changing the refractive index of at least a portion of the external cavity in response to an electrical signal.

16. Apparatus as defined in claim 15, wherein the refractive index changing means comprises an electro-optic crystal.

17. Apparatus as defined in claim 8, further comprising means for adjusting the phase operating point to adjust the spectral characteristics of the laser diode.

18. Apparatus as defined in claim 9, further comprising means for adjusting the phase operating point to adjust the spectral characteristics of the laser diode, said means comprising variable DC offset means connected to the summation means for applying an adjustable DC offset to the phase control signal.

19. Apparatus as defined in claim 13, further comprising means for adjusting the phase operating point to adjust the spectral characteristics of the laser diode, said means comprising mechanical adjustment means for adjusting the relative positions of the reflecting means and the laser diode.

20. Apparatus as defined in claim 8, further comprising means for driving the laser diode with a modulated current at a frequency much greater than the dither frequency.

* * * * *